(12) United States Patent
Su et al.

(10) Patent No.: US 8,582,387 B1
(45) Date of Patent: *Nov. 12, 2013

(54) METHOD AND APPARATUS FOR SUPPLYING POWER TO A STATIC RANDOM ACCESS MEMORY (SRAM) CELL

(71) Applicant: Marvell International Ltd., Hamilton (BM)

(72) Inventors: Jason T Su, Los Altos, CA (US); Karthik Swaminathan, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/673,666

(22) Filed: Nov. 9, 2012

Related U.S. Application Data

(63) Continuation of application No. 12/946,534, filed on Nov. 15, 2010, now Pat. No. 8,310,894, which is a continuation of application No. 12/547,182, filed on Aug. 25, 2009, now Pat. No. 7,835,217, which is a continuation of application No. 11/937,350, filed on Nov. 8, 2007, now Pat. No. 7,596,012.

(60) Provisional application No. 60/868,445, filed on Dec. 4, 2006.

(51) Int. Cl.
  *G11C 5/14* (2006.01)
(52) U.S. Cl.
  USPC ............ 365/226; 365/154; 365/227; 365/229

(58) Field of Classification Search
  None
  See application file for complete search history.

(56) References Cited

U.S. PATENT DOCUMENTS

| | | | |
|---|---|---|---|
| 5,301,147 A | 4/1994 | Guo et al. | |
| 5,581,500 A | 12/1996 | D'Souza | |
| 5,898,610 A | 4/1999 | Greason | |
| 7,394,714 B2 * | 7/2008 | Lin et al. | 365/227 |
| 7,400,545 B2 | 7/2008 | Ramaraju et al. | |
| 7,466,581 B2 | 12/2008 | Huang et al. | |
| 7,474,583 B2 | 1/2009 | Yamamura | |
| 7,486,586 B2 | 2/2009 | Fifield et al. | |
| 7,596,012 B1 | 9/2009 | Su et al. | |
| 7,835,217 B1 * | 11/2010 | Su et al. | 365/226 |
| 8,018,788 B2 | 9/2011 | Jung et al. | |
| 8,310,894 B1 * | 11/2012 | Su et al. | 365/226 |
| 2006/0268647 A1 | 11/2006 | Yamaoka et al. | |
| 2007/0236983 A1 | 10/2007 | Wang et al. | |
| 2008/0055967 A1 | 3/2008 | Houston et al. | |

* cited by examiner

*Primary Examiner* — Tan T. Nguyen

(57) ABSTRACT

Described herein are methods and apparatuses for write-assist voltage generation and power-down voltage scaling for static random access memory (SRAM) cells. According to various embodiments, an SRAM cell may include a local power supply voltage node for receiving a power supply voltage generated by a power supply voltage generator circuit, the generated power supply voltage being substantially equal to or less than a global power supply voltage provided to one or more transistors of the SRAM cell during a write-enable or power-down mode.

20 Claims, 4 Drawing Sheets

METHOD AND APPARATUS FOR SUPPLYING POWER TO A STATIC RANDOM ACCESS MEMORY (SRAM) CELL

CROSS REFERENCE TO RELATED APPLICATIONS

The present disclosure is a continuation of and claims priority to U.S. patent application Ser. No. 12/946,534, filed Nov. 15, 2010, now U.S. Pat. No. 8,310,894, issued Nov. 13, 2012, which is a continuation of U.S. patent application Ser. No. 12/547,182, filed Aug. 25, 2009, now U.S. Pat. No. 7,835, 217, issued Nov. 16, 2010, which is a continuation of U.S. patent application Ser. No. 11/937,350, filed Nov. 8, 2007, now U.S. Pat. No. 7,596,012, issued Sep. 29, 2009, which claims priority to U.S. Provisional Patent Application No. 60/868,445, filed Dec. 4, 2006, which are incorporated herein by reference.

TECHNICAL FIELD

Embodiments of the present invention relate generally to the field of integrated circuit memory devices, and more particularly, to static random access memory devices.

BACKGROUND

Static random access memory (SRAM) devices may be designed for providing acceptable read stability and/or write margins. As the technology advances, however, designing such margins has been increasingly difficult due at least in part to the scaling down of the minimum feature sizes of the transistors. The speed gain of the transistors, although desirable, has resulted in an increase in leakage current. In a memory array, comprising multiple SRAM cells, the leakage current may be amplified, which may result in an unacceptable level of power consumption and/or functional failures.

Measures taken to minimize the current leakage may, unfortunately, negatively impact the writeability of the SRAM cells. To compensate for the reduced writeability, various measures have been attempted including, for example, slowing down the write access and/or raising the operating voltage of the SRAM cell. Unfortunately, slowing down the write access to the SRAM cell may affect overall speed, while raising the operating voltage may affect the power consumption.

Various methods that attempted to overcome the foregoing write margin issues may nevertheless be inadequate for optimizing the SRAM design. For example, some methods are directed to increasing the word line voltage above the power supply voltage, but this may result in an increase in power consumption. Another method is directed to raising a local ground voltage to a voltage substantially equal to a global ground voltage, but this may require an increased silicon area by increasing the size of the SRAM cell itself. Further, the time for raising the local ground voltage may be slow due to slow current charging of the local ground.

SUMMARY

In view of the challenges in the state of the art, embodiments of the present invention are directed to methods and apparatuses for write-assist voltage generation and power-down voltage scaling for static random access memory (SRAM) cells. According to various embodiments, one or more SRAM cells may include a local power supply voltage node and a voltage generation means, such as a generator circuit, for driving the local power supply voltage node to a generated power supply voltage. For various embodiments, the generated power supply voltage may increase write margin during a write operation and/or may reduce current leakage during a power-down operation.

Other features that are considered as characteristic for various embodiments of the present invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

The phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Embodiments of the present invention are directed to methods and apparatuses for write-assist voltage generation and power-down voltage scaling for static random access memory (SRAM) cells. According to various embodiments, an SRAM may include a local power supply voltage node for receiving a power supply voltage generated by a power supply voltage generator circuit (sometimes referred to herein as "generator circuit"). The generated power supply voltage may be substantially equal to or less than a global power supply voltage provided, for example, by a power supply source. The global power supply voltage is provided to one or more transistors of the SRAM cell as in conventional SRAM devices. For embodiments wherein the generated power supply voltage is less than the global power supply voltage, the generated power supply voltage may increase write margin during a write operation and/or may reduce current leakage during a power-down operation.

Figure 1:
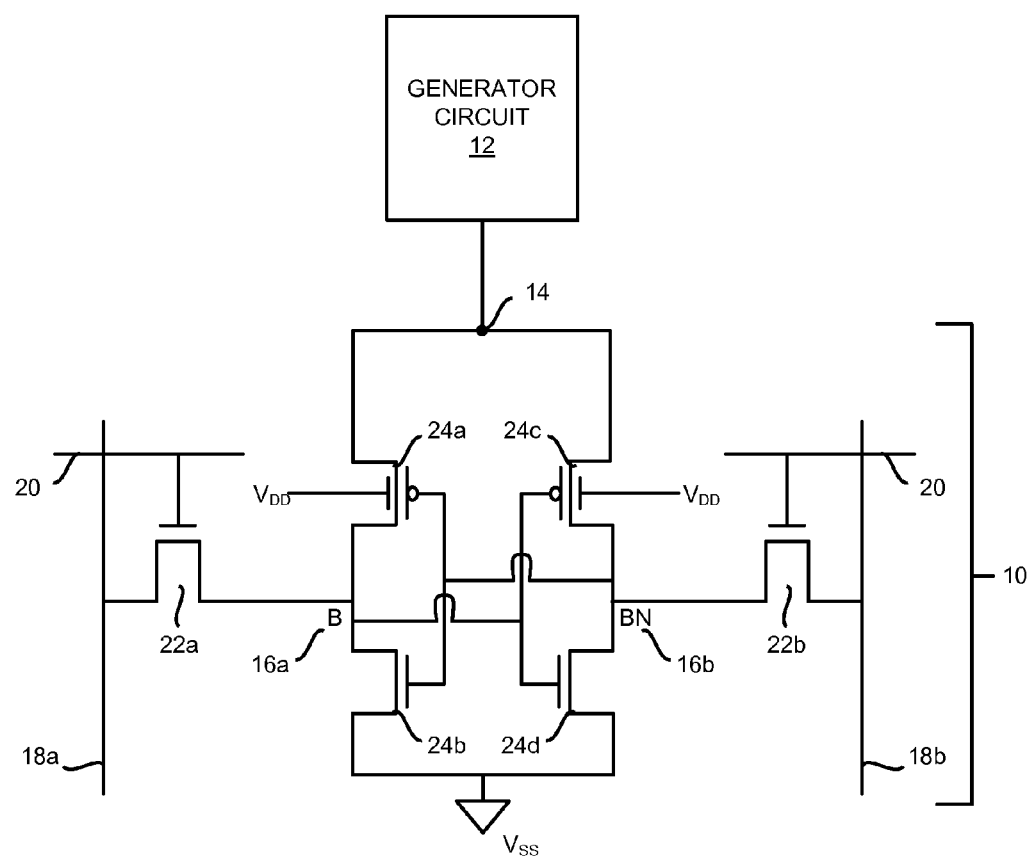
FIG. 1 is a schematic of an SRAM device, in accordance with various embodiments of the present invention.
Figure 2:
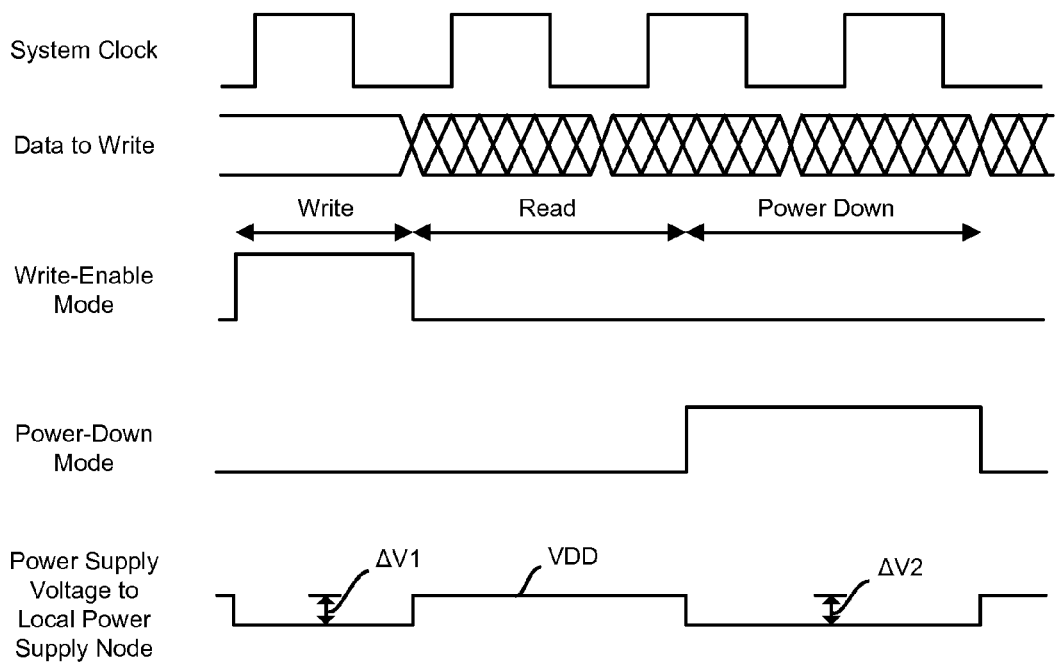
FIG. 2 is a timing diagram for an exemplary SRAM device, in accordance with various embodiments of the present invention.

Illustrated in FIG. 1 is an embodiment of a memory device, and in FIG. 2, illustrated is a timing diagram for various embodiments of such a memory device. The memory device may be a synchronous or an asynchronous SRAM device, depending on the application; that is, the memory device may be synchronous or asynchronous to the system clock (refer, e.g., to system clock of FIG. 2). As illustrated in FIG. 1, the memory device includes an SRAM cell 10 and a generator circuit 12. SRAM cell 10 may be a conventionally-known SRAM cell and thus, will not be explained in detail herein except where such explanation aids in the understanding of the present invention.

According to various embodiments, SRAM cell 10 may be configured to receive a first power supply voltage $V_{DD}$ (sometimes referred to herein as "global power supply voltage") and generator circuit 12 may be configured to drive a local power supply voltage node 14 to a second power supply voltage. First power supply voltage $V_{DD}$ may be any positive supply voltage suitable for the application, but generally excludes negative or ground voltages $V_{SS}$, as will become more evident by the discussion herein.

The second power supply voltage provided to local power supply voltage node 14 may depend at least in part on the status of SRAM cell 10. For example, SRAM cell 10 may at times be in a read mode, a write-enable mode, or a power-down mode. With regard to the power-down mode, such a status may refer generally to a data retention mode and/or to a lower-power-consumption mode. For example, power-down mode may refer to a standby mode.

During a read mode, bitlines 18a and 18b may be pulled high and the word line 20 asserted to switch on access transistors 22a and 22b. The values stored at nodes 16a (B) and 16b (BN) may then be transferred to bitlines 18a and 18b according to known conventions. For example, if node 16a holds a logic 0 value and node 16b holds a logic 1 value, bitline 18a may be discharged through access transistor 22a and memory transistor 24b to a logic 0, while bitline 18b is pulled to a logic 1 value through access transistor 22b and memory transistor 24c. According to various embodiments, during a read mode, the second power supply voltage provided to local power supply voltage node 14 by generator circuit 12 may be some voltage substantially equal to the first power supply voltage $V_{DD}$. Thus, in this example, bitline 18b is pulled to a logic 1 value toward $V_{DD}$ through access transistor 22b and memory transistor 24c.

During the write-enable mode, there may be some data to be written to SRAM cell 10. For example, a bit with a value of logic 1 may need to be written to a node (16a or 16b) of SRAM cell 10 currently storing a logic 0 value, or vice versa. The memory device may be placed into a write-enable mode by any method or device suitable for the purpose. For example, for various embodiments a write-enable control signal may be asserted by a processor to place the memory device in the write-enable mode.

As illustrated in FIG. 1, nodes 16a and 16b may store bits B and BN. If a logic 0 value is to be written to node 16a, with node 16a currently storing a logic 1 value, word line 20 may be asserted to switch on access transistor 22a and bitline 18a may be pulled low. The value stored at node 16a may accordingly be determined by a ratio of the resistances of access transistor 22a and memory transistor 24a. As illustrated, node 16a and memory transistors 24c and 24d are operatively coupled to node 18a, and thus switch the logic stored at 16b when node 16a falls below some predetermined voltage.

For some SRAM cells, writing to node 16a, particularly writing a logic 0 value when node 16a currently holds a logic 1 value, may be problematic. As noted, the value stored at node 16a may be determined by a ratio of the resistances of access transistor 22a and memory transistor 24a. Access transistor 22a and memory transistor 24a, however, may contend due to memory transistor 24a tending to hold the value of node 16a to a logic 1 due to the power supply voltage $V_{DD}$ supplied thereto, which may result in a poor write margin.

According to various embodiments and with reference to both FIG. 1 and FIG. 2, to increase the write margin during the write-enable mode, the second power supply voltage provided to local power supply voltage node 14 by generator circuit 12 may be some voltage $\Delta V1$ less than the first power supply voltage $V_{DD}$. By reducing the second power supply voltage relative to first power supply voltage $V_{DD}$, the resistance of memory transistor 24a may be increased to enable faster writing of the logic 0 value to node 16a, thereby increasing the write margin.

For various embodiments, generator circuit 12 may be configured to minimize current leakage from SRAM cell 10 during a power-down mode, thereby reducing total power consumption of SRAM cell 10. As with the write-enable mode, the power-down mode may be prompted by one or more control signals. For example, a power-down control signal may be asserted to place the memory device in the power-down mode.

According to various embodiments and with reference to both FIG. 1 and FIG. 2, during the power-down mode, the second power supply voltage provided to local power supply node 14 by generator circuit 12 may be some voltage $\Delta V2$ less than the first power supply voltage $V_{DD}$. For various embodiments, with second power supply voltage being a voltage $\Delta V2$ less than the first power supply voltage $V_{DD}$, source to body junctions of one or both of memory transistors 24a and 24c may be reverse biased due the source voltage being lower than the body voltage of the memory transistors 24a and 24c.

Figure 3:
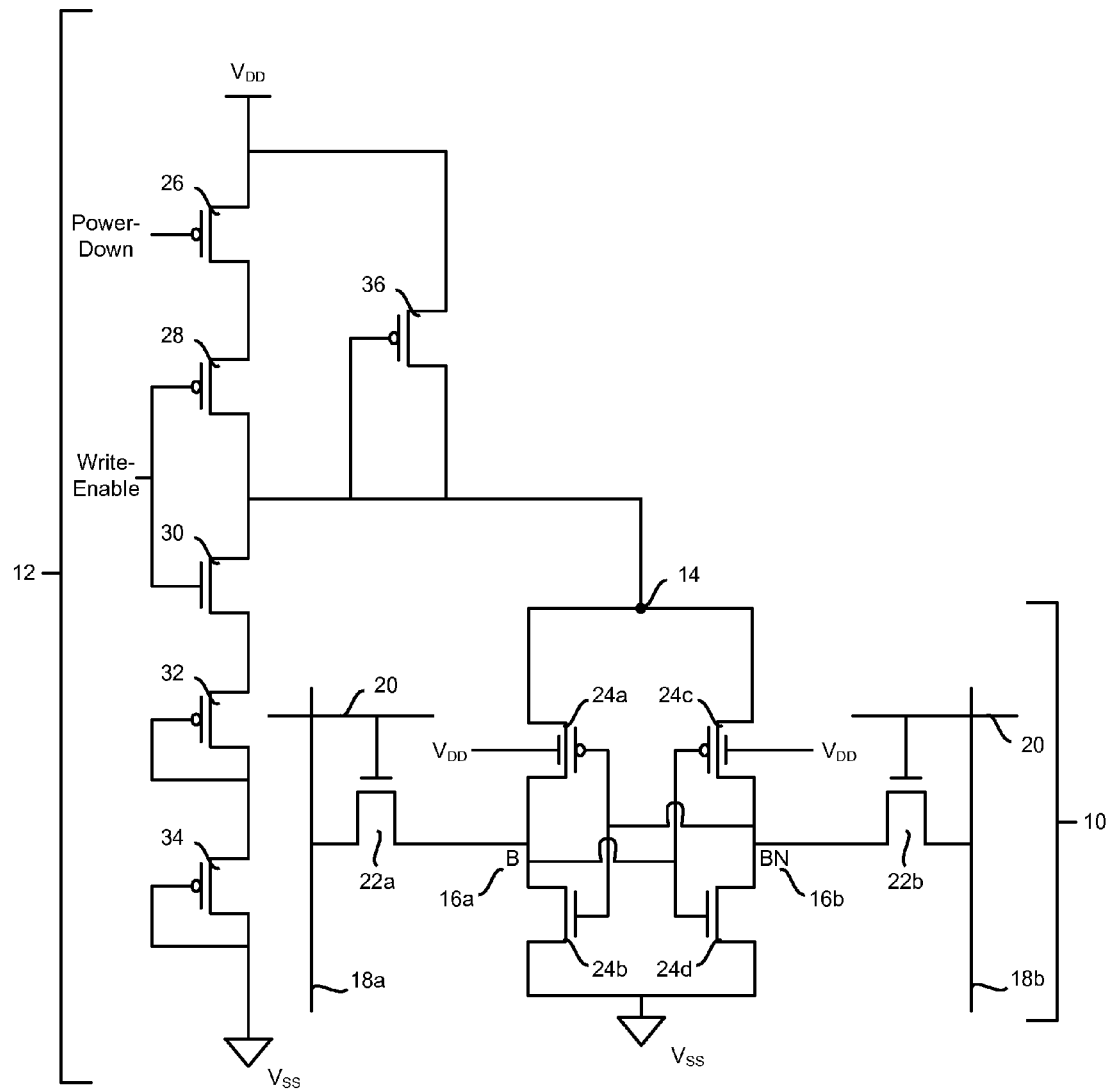
FIG. 3 is a schematic of another SRAM device, in accordance with various embodiments of the present invention.

Turning now to FIG. 3, illustrated is an exemplary embodiment of a memory device. As illustrated, the memory device may include an SRAM cell 10 including a local power supply voltage node 14 for receiving a power supply voltage generated by a generator circuit 12. SRAM cell 10 may include features similar to those of the exemplary SRAM cell 10 described herein with reference to FIG. 1, identical reference numerals referring to similar features.

As described previously, the generated power supply voltage may be substantially equal to or less than a global power supply voltage provided to one or more of SRAM cell 10 transistors 22a-b, 24a-d, for example, by a power supply source (not illustrated). For embodiments wherein the generated power supply voltage is less than the global power supply voltage, the generated power supply voltage may increase write margin during a write operation and/or may reduce current leakage during a power-down operation.

According to various embodiments, during a read mode, the second power supply voltage provided to local power supply voltage node 14 by generator circuit 12 may be some voltage substantially equal to the first power supply voltage $V_{DD}$ provided to one or more of transistors 22a-b, 24a-d of SRAM cell 10. During the write-enable mode or the power-down mode, however, the second power supply voltage provided to local power supply voltage node 14 by generator circuit 12 may be some voltage less than the first power supply voltage $V_{DD}$.

For various embodiments, generator circuit 12 may comprise one or more control transistors that, when switched on or off, controls, at least in part, the voltage at local power supply voltage node 14. As illustrated in FIG. 3, for example, generator circuit 12 comprises control transistors 26 and 28. During a read mode, control transistors 26 and 28 may be switched on to drive local power supply voltage node 14 to a voltage substantially equal to $V_{DD}$. Switching of control transistors 26 and 28 may be controlled at least in part by one or more control signals. For example, control transistor 26 may be switched by a power-down control signal whereas control transistor 28 may be switched by a write-enable control signal. Although control transistors 26 and 28 are depicted as active low transistors, one or more active high transistors may instead be used, depending on the particular application.

During the write-enable mode, generator circuit 12 may be variously configured for driving local power supply voltage node 14 to a voltage less than the first power supply voltage $V_{DD}$. For the illustrated embodiment, generator circuit 12 may include control transistors 28 and 30, which may be configured to be switched by a write-enable control signal, where a control signal results in one of the transistors being switched on and the other switched off. Although control transistor 28 is depicted as an active low transistor and control transistor 30 as an active high transistor, the configuration may be reversed, depending on the application. That is, control transistor 28 may instead be an active high transistor and control transistor 30 may be an active low transistor.

For the embodiment illustrated in FIG. 3, control transistors 28 and 30 may be configured to switch off and on, respectively, when a write-enable control signal is asserted high. Switching control transistors 28 and 30 off and on, respectively, may drive local power supply voltage node 14 to a voltage $\Delta V1$ less than $V_{DD}$ due at least in part to the resistance of at least control transistor 30. With respect to control transistor 30 in the illustrated embodiment, switching on control transistor 30 establishes a connection between local power supply voltage node 14 and a ground voltage $V_{SS}$ of generator circuit 12, which may result in local power supply voltage node 14 being driven to the reduced voltage with respect to $V_{DD}$. Reducing the voltage on local power supply voltage node 14 may have the effect of increasing the resistance of memory transistor 24a and/or 24c, as described herein, thereby increasing the write margin of SRAM cell 10 so that a bit may be written faster and/or more accurately to node 16a and/or node 16b.

Generator circuit 12 may include one or more other control transistors for further selectively controlling the voltage at local power supply voltage node 14 during a write mode. For example, generator circuit 12 may include one or more other control transistors in addition to control transistors 28, 30, and one or more of the other control transistors may be included between control transistor 30 and the ground voltage $V_{SS}$ of generator circuit 12. Referring to FIG. 3, for example, illustrated are control transistors 32, 34, and 36, with control transistors 32 and 34 disposed between control transistor 30 and the ground voltage $V_{SS}$. During a write mode, the voltage at local power supply voltage node 14 is determined, at least in part, by the resistances of control transistors 30, 32, 34, and 36, the voltage at the local power supply voltage node 14 being less than $V_{DD}$.

During a power-down mode, the power supply voltage provided to local power supply voltage node 14 by generator circuit 12 may be some voltage $\Delta V2$ less than power supply voltage $V_{DD}$. For various embodiments, generator circuit 12 may comprise one or more control transistors, which when switched on or off, controls at least in part the voltage at local power supply voltage node 14. As illustrated in FIG. 3, for example, generator circuit 12 comprises control transistors 26-36. During a power-down mode, control transistor 26 may be switched off so that local power supply voltage node 14 is driven to a voltage determined at least in part by the threshold voltage $V_t$ of control transistor 36. For example, in various embodiments, the voltage at local power supply voltage node 14 may be about $V_{DD}$-$V_t$. Generator circuit 12 may include one or more other control transistors in addition to control transistor 36, depending on the desired power-down voltage desired at local power supply voltage node 14.

Switching of one or more of control transistors 26-30 may be controlled at least in part by one or more control signals. For example, control transistor 26 may be switched by a power-down control signal. Although control transistor 26 is depicted as an active low transistor, it may instead be an active high transistor, depending on the particular application. Similarly, any one or more other control transistors such as, for example, control transistors 28 and 30, may be either switched on or off during a power-down mode. For various embodiments, however, only one of the control signals may be asserted high or low, depending on the switching state (active high or active low) of the control transistors. For example, during a power-down mode, it may be desirable that control transistor 28 be switched off in addition to control transistor 26, which in the illustrated exemplary embodiment may occur by way of an active high control signal.

In any event, with the power supply voltage to local power supply voltage node 14 being voltage $\Delta V2$ less than power supply voltage $V_{DD}$, source to body junctions of one or both of memory transistors 24a and 24c are reverse biased due to the source voltage being lower than the body voltage of the transistors. Such reverse biasing may lead to reduced power consumption due to reduced current leakage.

FIG. 3 generally depicts generator circuit 12 as being configured to be selectively placed into both power-down and write modes, as well as a read mode by way of nonselection of power-down and write modes. Other configurations are possible, however. For example, generator circuit 12 may be configured to be selectively placed into a power-down mode as well as a read mode by way of non-selection of the power-down mode, but may not be configured to be selectively placed into a write mode. Similarly, in some embodiments, generator circuit 12 may be configured to be selectively placed into a write mode as well as a read mode by way of nonselection of the write mode, but may not be configured to be selectively placed into a power-down mode.

Figure 4:
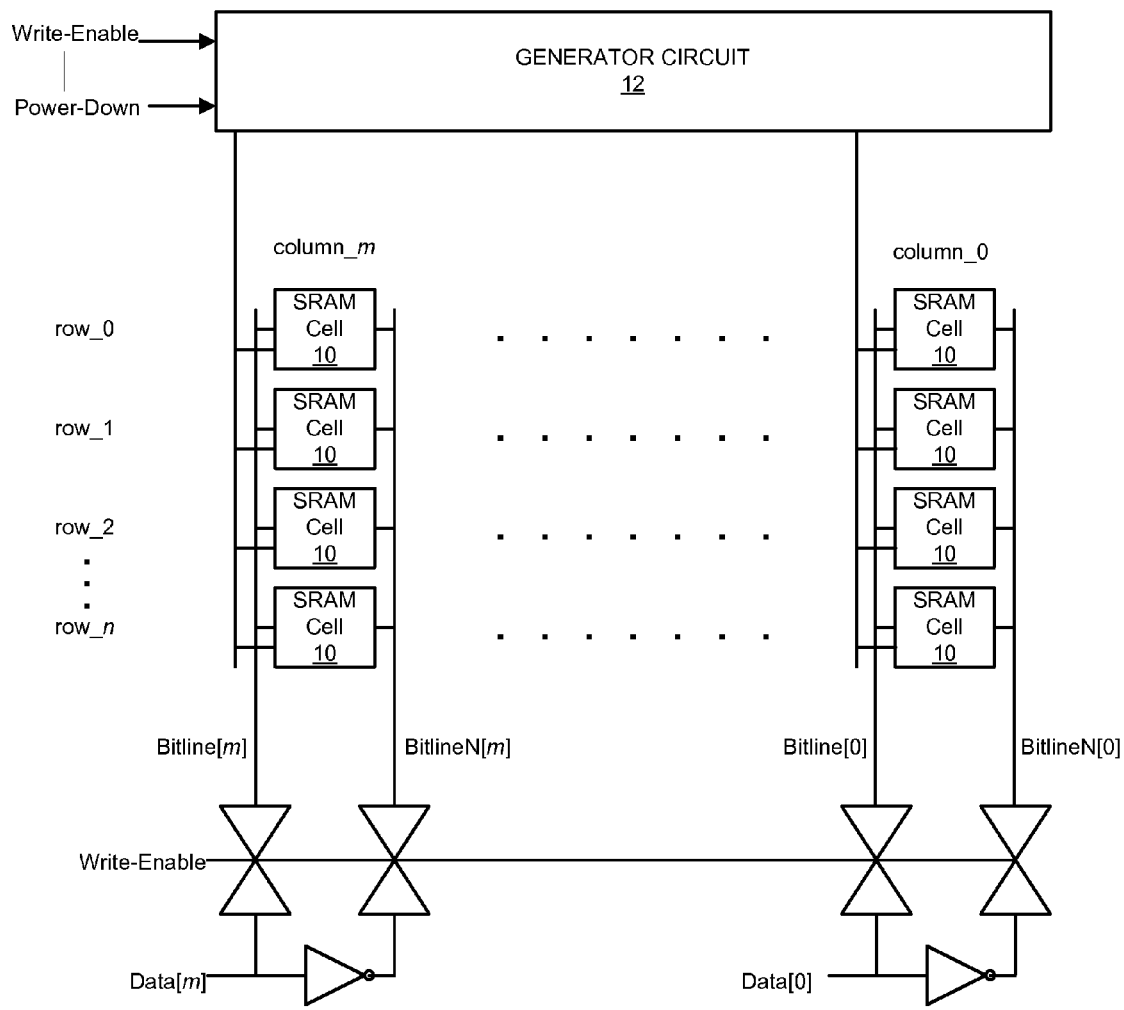
FIG. 4 is a schematic of another SRAM device, in accordance with various embodiments of the present invention.

Although FIG. 1 and FIG. 3 generally depict a single generator circuit 12 being configured to drive the local supply voltage node of one SRAM cell 10 to a selected voltage, generator circuit 12 may, in various embodiments, be configured to drive the local supply voltage node of two or more SRAM cells to a selected voltage. As illustrated in FIG. 4, for example, a memory device may comprise a generator circuit 12 and an array of SRAM cells 10. As in conventional SRAM arrays, the array of SRAM cells 10 may comprise columns column_0 through column_m, and rows row_0 through row_n.

As discussed more fully herein, during a write-enable mode prompted, e.g., by a write-enable control signal, some data (e.g., one or more of data[0]-data[m]) may need to be written to one or more SRAM cells 10. In the write-enable mode, generator circuit 12 may drive a local power supply voltage node of one or more of the SRAM cells 10 to a voltage less than the power supply voltage $V_{DD}$ by a voltage difference $\Delta V1$. During the power-down mode prompted, e.g., by a power-down control signal, generator circuit 12 may drive a local power supply voltage node of one or more of the SRAM cells 10 to a voltage less than the power supply voltage $V_{DD}$ by a voltage difference $\Delta V2$.

According to various embodiments, generator circuit 12 may advantageously be disposed externally to SRAM cell 10 so that the chip area at the memory cell level need not be increased. Referring to FIG. 4, for example, generator circuit 12 may be integral to the SRAM cell array or may instead be external thereto, depending on the application. Accordingly, an increase in the size of the SRAM cell array may be avoided to the extent desired for the application.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A memory device comprising:
    a static random access memory cell configured to operate in accordance with an operating mode, the static random access memory cell comprising
        (i) a memory transistor configured to receive a first power supply voltage, and
        (ii) a power supply voltage node configured to receive a second power supply voltage; and
    a generator circuit configured to
        based at least in part on (i) the operating mode of the static random access memory cell and (ii) the first power supply voltage, generate the second power supply voltage, and
        supply the second power supply voltage to the power supply voltage node of the static random access memory cell.

2. The memory device of claim 1, wherein the generator circuit is further configured to:
    in response to the operating mode of the static random access memory cell operating corresponding to a first operating mode, generate the second power supply voltage such that a voltage level of the second power supply voltage is substantially equal to a voltage level of the first power supply voltage; and
    in response to the operating mode of the static random access memory cell corresponding to a second operating mode, generate the second power supply voltage such that the voltage level of the second power supply voltage is substantially different from the voltage level of the first power supply voltage.

3. The memory device of claim 1, wherein the generator circuit is further configured to, in response to the operating mode of the static random access memory cell corresponding to a read mode, generate the second power supply voltage such that a voltage level of the second power supply voltage is substantially equal to a voltage level of the first power supply voltage.

4. The memory device of claim 3, wherein the operating mode of the static random access memory cell corresponds to the read mode when data is being read from the static random access memory cell.

5. The memory device of claim 1, wherein the generator circuit is further configured to, in response to the operating mode of the static random access memory cell corresponding to a write enable mode, generate the second power supply voltage such that a voltage level of the second power supply voltage is less than a voltage level of the first power supply voltage.

6. The memory device of claim 5, wherein the operating mode of the static random access memory cell corresponds to the write enable mode when data is being written to the static random access memory cell.

7. The memory device of claim 1, wherein the generator circuit is further configured to, in response to the operating mode of the static random access memory cell corresponding to a power down mode, generate the second power supply voltage such that a voltage level of the second power supply voltage is less than a voltage level of the first power supply voltage.

8. The memory device of claim 7, wherein the operating mode of the static random access memory cell corresponds to the power down mode when (i) neither of a read operation and a write operation is being performed by the static random access memory cell and (ii) one or more components of the static random access memory cell are either switched off or are in a low power mode.

9. The memory device of claim 1, wherein the generator circuit is further configured to:
    receive a control signal indicating the operating mode of the static random access memory cell; and
    in response to receiving the control signal indicating the operating mode of the static random access memory cell, generate the second power supply voltage.

10. The memory device of claim 1, wherein:
    the static random access memory cell is disposed on an integrated circuit chip; and
    the generator circuit is disposed externally to the integrated circuit chip.

11. The memory device of claim 1, wherein the generator circuit comprises:
    a plurality of switching components, wherein each of the plurality of switching components is configured to be switched on or off, based on the operating mode of the static random access memory cell.

12. The memory device of claim 1, wherein the memory transistor comprises:
    a body configured to receive the first power supply voltage; and
    a source terminal configured to receive the second power supply voltage.

13. A method comprising:
    receiving, by a memory transistor of a static random access memory cell, a first power supply voltage;
    based at least in part on (i) an operating mode of the static random access memory cell and (ii) the first power supply voltage, generating a second power supply voltage; and
    receiving, by a power supply voltage node of the static random access memory cell, the second power supply voltage.

14. The method of claim 13, wherein generating the second power supply voltage further comprises:
    in response to the operating mode of the static random access memory cell corresponding to a first operating mode, generating the second power supply voltage such that a voltage level of the second power supply voltage is substantially equal to a voltage level of the first power supply voltage; and in response to the operating mode of the static random access memory cell corresponding to a second operating mode, generating the second power supply voltage such that the voltage level of the second power supply voltage is substantially different from the voltage level of the first power supply voltage.

15. The method of claim 13, wherein generating the second power supply voltage further comprises:

in response to the operating mode of the static random access memory cell corresponding to a read mode, generating the second power supply voltage such that a voltage level of the second power supply voltage is substantially equal to a voltage level of the first power supply voltage.

16. The method of claim 13, wherein generating the second power supply voltage further comprises:

in response to the operating mode of the static random access memory cell corresponding to a write enable mode, generating the second power supply voltage such that a voltage level of the second power supply voltage is less than a voltage level of the first power supply voltage.

17. The method of claim 13, wherein generating the second power supply voltage further comprises:

in response to the operating mode of the static random access memory cell corresponding to a power down mode, generating the second power supply voltage such that a voltage level of the second power supply voltage is less than a voltage level of the first power supply voltage.

18. The method of claim 13, further comprising:

receiving a control signal indicating the operating mode of the static random access memory cell, wherein generating the second power supply voltage further comprises in response to receiving the control signal indicating the operating mode of the static random access memory cell, generating the second power supply voltage.

19. The method of claim 13, wherein the second power supply voltage is generated by a generator circuit, and wherein the method further comprises:

disposing the static random access memory cell on an integrated circuit chip; and disposing the generator circuit such that the generator circuit is external to the integrated circuit chip.

20. The method of claim 13, further comprising:

receiving, by a body of the memory transistor of the static random access memory cell, the first power supply voltage; and receiving, by a source terminal of the memory transistor of the static random access memory cell, the second power supply voltage.

* * * * *